United States Patent
Chen et al.

(10) Patent No.: US 6,437,512 B1
(45) Date of Patent: Aug. 20, 2002

(54) PLASMA GENERATOR

(75) Inventors: Bing-Hung Chen, Tainan; Tse-Yao Huang, Taipei, both of (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 09/712,201

(22) Filed: Nov. 15, 2000

(30) Foreign Application Priority Data

May 31, 2000 (TW) .......................................... 89110551 A

(51) Int. Cl.⁷ ................................................. H01J 7/24
(52) U.S. Cl. ............................. 315/111.21; 118/723 R; 118/723 NW; 118/733; 427/575
(58) Field of Search ....................... 315/111.21, 111.31, 315/111.71; 118/723 R, 723 NW, 733; 204/298.07, 298.08, 298.15, 298.33; 427/523, 569, 575

(56) References Cited

U.S. PATENT DOCUMENTS

| | | | | |
|---|---|---|---|---|
| 5,597,438 A | * | 1/1997 | Grewl et al. ................. 156/345 |
| 5,783,492 A | * | 7/1998 | Higuchi et al. .............. 438/710 |
| 5,897,713 A | * | 4/1999 | Tomika et al. ............ 118/723 I |
| 6,027,603 A | * | 2/2000 | Holland et al. .............. 156/345 |
| 6,265,031 B1 | * | 7/2001 | Ishii et al. ................... 427/460 |

* cited by examiner

Primary Examiner—Don Wong
Assistant Examiner—Thuy Vinh Tran
(74) Attorney, Agent, or Firm—Birch, Stewart, Kolasch & Birch, LLP

(57) ABSTRACT

A plasma generator comprises an ICP chamber and a surface wave conducting device. The upper wall of the ICP chamber is a quartz plate, and an electrode inside the lower ICP chamber is coupled with a RF bias supply. The ICP chamber is used to produce a first plasma. The surface wave conducting device is located on the quartz plate. The surface wave conducting device can make a microwave become a standing microwave, then a second plasma excited by the standing microwave is produced in the upper ICP chamber. Then, the first plasma and the second plasma are mixed in the ICP chamber.

11 Claims, 1 Drawing Sheet

PLASMA GENERATOR

BACKGROUND OF THE INVENTION

1. Field of the Invention

The present invention relates to a plasma generator. More particularly, the present invention relates to a plasma generator which combines an inductively coupled plasma (ICP) generator and a surface wave plasma generator.

2. Description of the Prior Art

Plasma is a partially ionized gas, and has been widely applied to semiconductor processes, such as deposition, etching, ion implantation and surface treatment. In the application of plasma in the etching process, there are three main mechanisms: one is using partical bombardment with physical behavior; another is to decompose moleculars to reactive ions for thin film by plasma, then an etching process is proceeded with drawing the volatile product out by a vacuum system, which is produced by the reaction between the ions and the thin film; the other is to proceed etching process by combining the physical and chemical removing thin film mechanism.

If the etched thin film is metal, the main plasma etching gases are $Cl_2$ and $BCl_3$. Cl ions made from $Cl_2$ react with metal to form volatile metal chloride so as to etch the metal layer. The size of the ions produced by traditional ICP generator is smaller, and the main ion is $Cl^+$. A higher aspect ratio and a higher electron temperature are obtained when the metal layer is etched by the above-mentioned plasma. However, higher electron temperature will waste photoresist, therefore, thicker photoresist is requested to prevent distortion. If the metal layer is etched by the plasma generated by surface wave plasma generator, a lower electron temperature is obtained. Then, the photoresist will not be wasted too much, and the thickness of that can be reduced. However, the size of the ions, such as $BCl_2^+$, $BCl_3^+$ and $BCl^+$, produced by the surface wave plasma generator is too big to obtain higher aspect ratio when etching the metal layer.

With the linewidth getting smaller and the integration larger, how to reduce the thickness of the photoresist to enhance the resolution in exposure process and increase the aspect ratio between metal lines to enhance the integration have become increasingly important.

SUMMARY OF THE INVENTION

An object of the present invention is to provide a plasma source to etch the metal layer without wasting photoresist and with getting higher aspect ratio.

Another object of the present invention is to provide a plasma generator which combines the advantages of the ICP generator and surface wave plasma generator.

Another object of the present invention is to provide a plasma generator which can adjust the ratio of bigger ions and smaller ions.

The present invention provides a plasma generator, comprising an ICP chamber and a surface wave conducting device. The ICP chamber having a quartz plate as an upper wall and an electrode coupled to a RF bias supply in the lower ICP chamber is used to produce a first plasma. The surface wave conducting device is located on the quartz plate and used to produce a second plasma in the upper ICP chamber. Then, the first plasma and the second plasma are mixed together inside the ICP chamber.

The present invention provides a plasma generator, suitable for etching a thin film on a wafer, comprising an ICP chamber and a surface wave conducting device. The ICP chamber having a chamber wall, a coil surrounding the chamber wall and a gas inlet on the chamber wall, a quartz plate as an upper wall, and an electrode coupled to a RF bias supply in the lower ICP chamber is used to produce a first plasma. A gas source is introduced through the gas inlet to the ICP chamber. The surface wave conducting device is located on the quartz plate and used to produce a second plasma in the upper ICP chamber. Then, the first plasma and the second plasma are mixed together inside the ICP chamber.

According to the preferred embodiment of the present invention, a lot of slots are located on one side of the surface wave conducting device near the quartz plate.

BRIEF DESCRIPTION OF THE DRAWINGS

The present invention will become more fully understood from the detailed description given herein below and the accompanying drawings, given by way of illustration only and thus not intended to be limitative of the present invention.

DETAILED DESCRIPTION OF THE PREFERRED EMBODIMENT

Figure 1:
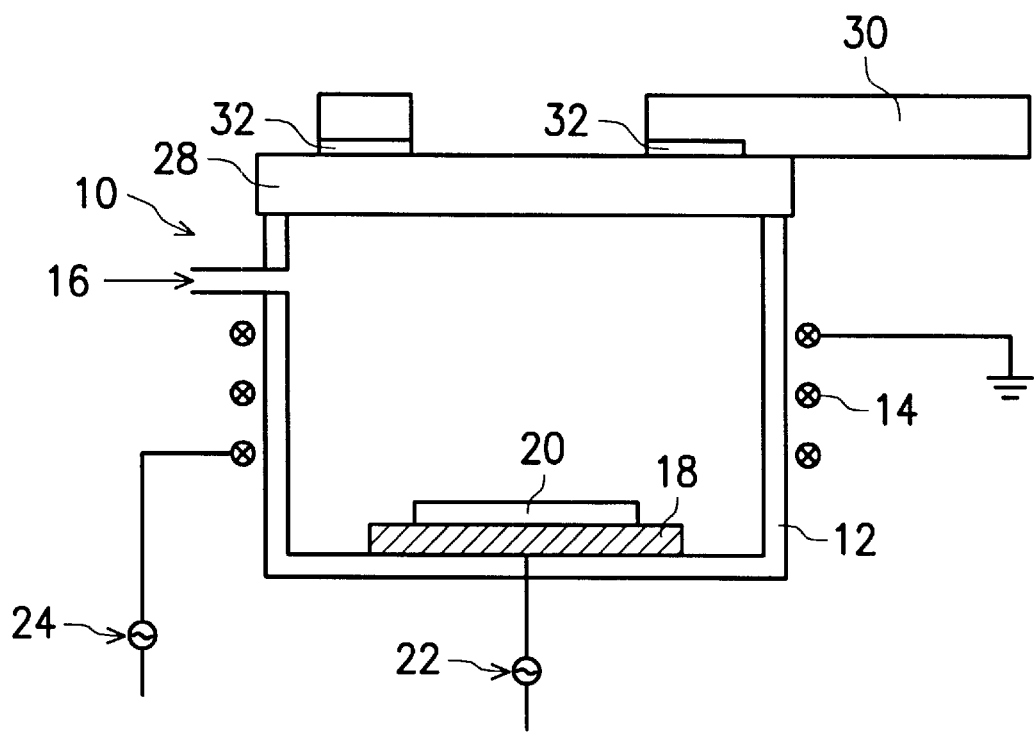
FIG. 1 is a cross-sectional view of the plasma generator according to the embodiment of the present invention.
Figure 2:
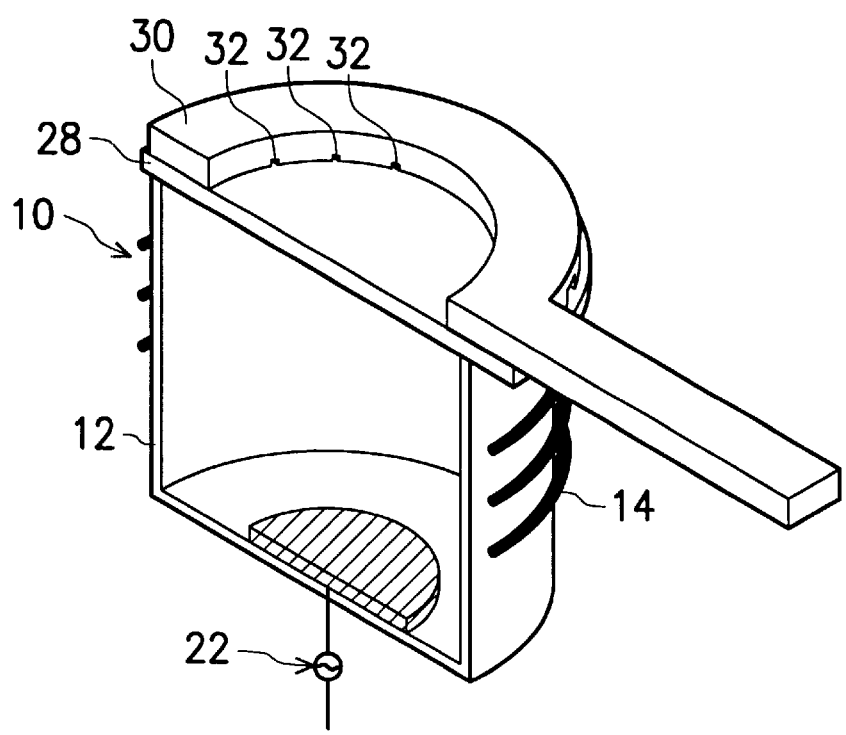
FIG. 2 is a perspective view of FIG. 1.

Referring to FIG. 1, a cross-sectional view of the plasma generator is shown, and FIG. 2 shows a perspective view thereof.

The plasma generator of the present invention includes an ICP chamber 10 and a surface wave conducting device 30. A quartz plate 28 isolating the ICP chamber 10 from the surface wave conducting device 30 constitutes an upper wall of the ICP chamber 10.

The ICP chamber 10 consists chiefly of a chamber wall 12 and a coil 14 surrounding the chamber wall 12. The coil 14 is a spiral coil of which one side is coupled with a RF bias of about 13.56 MHz, the other side is grounded, so as to produce an electromagnetic field inside the ICP chamber 10. One part of the gas source entering from a gas inlet 16 disposed in the chamber wall 12 is excited to produce a first plasma which has higher electron temperature.

A electrode 18 used to support a wafer 20 is disposed in the lower ICP chamber 10 and coupled with a RF bias supply 22.

The surface wave conducting device 30 is connected with a microwave source generator (not shown). The microwave becomes a standing microwave inside the surface wave conducting device 30. One side of the surface wave conducting device 30 has many symmetrical slots 32 near the quartz plate 28 so that the standing microwave can transmit to the ICP chamber 10 through the quartz plate 28. Then, the other part of the gas source is excited to produce a second plasma, which has lower electron temperature, by the standing microwave near the quartz plate 28. The preferred material of the surface wave conducting device 30 is polytetrafluoroethylene (PTFE).

The first plasma generated by the electromagnetic field and the second plasma generated by the standing microwave near the quartz plate 28 are mixed together inside the ICP chamber 10. The mixed plasma driven by the electrode 18 coupled with the RF bias supply 22 is used to anisotropically etch the wafer 20.

When the plasma generator of the present invention is applied to etch a metal layer over the wafer 20, the gas source entered from gas inlet 16 is $Cl_2$ and $BCl_3$. With the assistance of coil 14, the first plasma excited by the electromagnetic field and produced inside the ICP chamber 10 is composed of smaller ions, such as $Cl^+$. The second plasma excited by the standing microwave produced by the surface wave conducting device 30 is composed of bigger ions, such as $BCl_2^+$, $BCl_3^+$ and $BCl^+$. Although the first plasma excited by electromagnetic field has higher electron temperature, however, the second plasma excited by the standing microwave has lower electron temperature, the mixed plasma has relative lower electron temperature under the existence of a mass of $Cl^+$. Therefore, the loss of the photoresist can be reduced, and the coating thickness of the photoresist can also be reduced, so as to enhance the resolution of the patterns in the photoresist.

According to the above-mentioned description, the advantages of the present invention are as follows:

1. The plasma source produced by the plasma generator according to the present invention can be used to prevent the loss of photoresist and enhance the aspect ratio.
2. The mixed plasma has not only lower electron temperature but also higher concentration of the $Cl^+$. Therefore, when the plasma generator is applied to etch the metal layer, during performing the etching process, the loss of photoresist is suppressed and the aspect ratio is increased.
3. The plasma generator of the present invention combines the characteristic of small size ion in ICP generator and the characteristic of lower electron temperature in surface wave plasma generator.
4. The plasma generator of the present invention can be applied in etching not only metal layer but also other materials.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A plasma generator, comprising:
    an inductively coupled plasma (ICP) chamber used to produce a first plasma having a quartz plate as an upper wall of the ICP chamber, and having an electrode coupling to a RF bias supply in the lower ICP chamber; and
    a surface wave conducting device located on the quartz plate and used to produce a second plasma in the upper ICP chamber, wherein the first plasma and the second plasma are mixed together in the ICP chamber.

2. The plasma generator as claimed in claim 1, wherein the electrode is used to support a wafer.

3. The plasma generator as claimed in claim 1, wherein the ICP chamber is constructed by a chamber wall and a coil surrounding the chamber wall.

4. The plasma generator as claimed in claim 1, wherein a plurality of slots are located on one side of the surface wave conducting device near the quartz plate.

5. The plasma generator as claimed in claim 1, wherein the material of the surface wave conducting device comprises PTFE.

6. A plasma generator, suitable for etching a thin film on a wafer, comprising:
    an ICP chamber having a chamber wall, a coil surrounding the chamber wall and a gas inlet on the chamber wall, wherein a quartz plate is used as an upper wall of the ICP chamber, and an electrode coupling to a RF bias supply is located in the lower ICP chamber;
    a gas source introduced through the gas inlet to the ICP chamber, wherein one part of the gas source is excited by an electromagnetic field generated by the coil to produce a first plasma with smaller size ions; and
    a surface wave conducting device located on the quartz plate and used to produce a second plasma with lower electron temperature in the upper ICP chamber, wherein the first plasma and the second plasma are mixed together in the ICP chamber.

7. The plasma generator as claimed in claim 6, wherein the wafer is located on the electrode.

8. The plasma generator as claimed in claim 6, wherein a plurality of slots are located on one side of the surface wave conducting device near the quartz plate.

9. The plasma generator as claimed in claim 6, wherein the thin film comprises metal thin film.

10. The plasma generator as claimed in claim 9, wherein the gas source comprises $Cl_2$ and $BCl_3$.

11. The plasma generator as claimed in claim 9, wherein the first plasma chiefly comprises $Cl^+$.

* * * * *